United States Patent [19]

Ahmad et al.

[11] Patent Number: 4,929,054
[45] Date of Patent: May 29, 1990

[54] MOUNTING FOR HIGH RESOLUTION PROJECTION LENSES

[75] Inventors: Anees Ahmad, Bethel; Richard L. Huse, Norwalk, both of Conn.

[73] Assignee: The Perkin-Elmer Corporation, Norwalk, Conn.

[21] Appl. No.: 914,953

[22] Filed: Oct. 3, 1986

Related U.S. Application Data

[63] Continuation-in-part of Ser. No. 856,882, Apr. 28, 1986, abandoned.

[51] Int. Cl.$^5$ .............................................. G02B 7/02
[52] U.S. Cl. ..................................... 350/252; 24/493; 248/603; 350/253
[58] Field of Search ................................ 350/252-253, 350/631; 248/560, 603-604, 615; 24/493

[56] References Cited

U.S. PATENT DOCUMENTS

| | | | |
|---|---|---|---|
| 2,477,705 | 8/1949 | Sweet | 350/252 |
| 2,571,187 | 10/1951 | Baxter, Jr. | 350/252 |
| 2,937,571 | 5/1960 | Thompson | 350/252 |
| 4,420,223 | 12/1983 | Watanabe et al. | 350/631 |
| 4,586,787 | 5/1986 | Fiandra et al. | 350/252 |

OTHER PUBLICATIONS

Hopkins, R. E. "Lens Mounting and Centering" App. Optics & Optical Engineering, vol. VIII, Academic Press, 1980, pp. 31-41.
Yoder, Jr. P. R. "Lens Mounting Techniques" Proc SPIE vol. 389, 1983, pp. 2-11.
Carnell et al "Some Experiments on Pricision Lens Centering & Mounting" Optica Acta, 8-1974, pp. 615-629.

*Primary Examiner*—Bruce Y. Arnold
*Assistant Examiner*—Martin Lerner
*Attorney, Agent, or Firm*—Edwin T. Grimes; Thomas P. Murphy

[57] ABSTRACT

A lens mount including a lens cell wherein a lens is mounted through flexures. The lens seat in the lens cell has a radius of curvature match-mated to the lens surface which rests upon it. The rotational symmetry axis of the lens seat is coincident with the axis of rotation of the lens cell. The optical axis of the second lens surface is coincident with the axis of rotation of the lens cell.

2 Claims, 1 Drawing Sheet

MOUNTING FOR HIGH RESOLUTION PROJECTION LENSES

This application is a Continuation-in-part of out pending application Ser. No. 856,882 filed Apr. 28, 1986 now abandoned entitled "MOUNTING FOR HIGH RESOLUTION PROJECTION LENSES".

FIELD OF INVENTION

The present invention relates to an apparatus and method for mounting high resolution projection lenses and, more particularly, to such apparatus and method wherein the lens is mounted to the lens cell following the machining of the cell.

BACKGROUND OF THE INVENTION

In order to get optimum performance from high resolution lithographic lens assembles it is imperative that all lenses in a given assembly be centered, within a few microns, to a common optical axis. Further, these lens mounts are expected to maintain an extremely high level of performance under a multitude of environmental conditions during use, storage and shipping.

Lenses are commonly affixed within lens cells with mechanical devices. Differences in the coefficient of thermal expansion between the lens and the lens cell can lead to decentration and intolerable stresses in the lens during ambient temperature changes.

One approach to the solution of the foregoing problems is given by U.S. Pat. application Ser. No. 818,925 filed Jan. 15, 1984 now U.S. Pat. No. 4,733,945 issued 3/29/88 which is assigned to the same assignee as the present invention. This approach calls for the lens to be mounted to a lens cell through flexure means. These flexure means return the lens to a predetermined spatial relation to the lens cell following temperature excursions away from, then back to, the datum temperature. Following the lens being mounted to the lens cell the outer diameter and upper and lower surfaces of the lens cell are precision machined with respect to the optical axis of the lens.

While this approach offered significant advantages over the prior art it does have several drawbacks. There is a chance of damaging the lens mounted in the lens cell during the machining of the lens cell. Also, if an error were made in machining the lens cell it is relatively difficult to remove the lens for installation in another lens cell. This last feature is desirable in that the lenses are quite expensive.

The present invention eliminates or ameliorates the foregoing disadvantages of the prior art by providing a lens mount unaffected by large temperature excursions, which can be easily and safely machined without endangering the lens and which can be easily disassembled. In addition, the lens mount provided is very stable and has a high resonant frequency.

BRIEF DESCRIPTION OF THE INVENTION

In order to achieve the desired results the present invention provides an apparatus and method for the mounting of lenses to lens cells.

Briefly, the lens cell is machined with a spherical seat for a lens concentric with the axis of rotation. The outer diameter of the lens cell is concentric with the axis of rotation and the top and bottom surfaces of the lens cell are machined perpendicular to the axis of rotation. Three flexure assembles are then affixed to the inner diameter of the lens cells.

The lens cell is then placed on an air-bearing table and centered on its axis of rotation by indicating the reference outer surface by using an electronic/air gage. The lens is then placed on its seat in the cell. An electronic/air gage is used to indicate the top surface of the lens and the air-bearing table is rotated. The lens is then moved on its seat, relative to the lens cell, so as to minimize the wobble of the top surface of the lens. At this stage, the axis of the lens is concentric with the axis of the air-bearing table and the axis of the outer diameter of the lens cell. The lens is then bonded to the three flexures.

A lens assembly can be made by stacking together a plurality of lens cells fabricated in the manner just described. These cells are stacked and centered on the axis of an air-bearing table by bringing all of their outside diameters into concentricity. The plurality of lens cells, so aligned, are then bonded together to obtain the final lens assembly.

There has thus been outlined rather broadly the more important features of the invention in order that the detailed description thereof that follows may be better understood, and in order that the present contribution to the art may be better appreciated. There are, of course, additional features of the invention that will be described hereinafter and which will form the subject of the claims appended hereto. Those skilled in the art will appreciate that the conception on which the disclosure is based may readily be utilized as a basis for designing other structures for carrying out the several purposes of the invention. It is important, therefore, that the claims be regarded as including such equivalent structures as do not depart from the spirit and scope of the invention.

Specific embodiments of the invention have been chosen for purposes of illustration and description, and are shown in the accompanying drawings, forming a part of the specification.

DETAILED DESCRIPTION OF A PREFERRED EMBODIMENT

Figure 1:
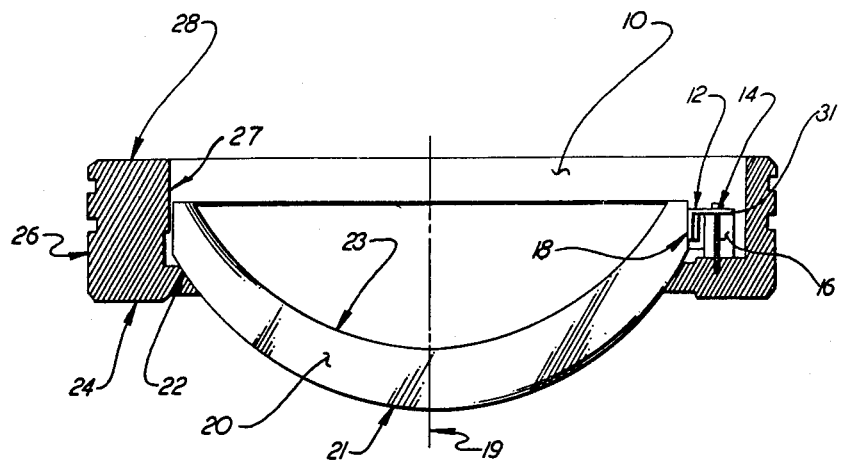
FIG. 1 is a side sectional view of a lens cell in accordance with the present invention showing the lens attached.

FIG. 1 shows a side sectional view of a lens cell 10 having a lens 20 constrained therein.

The lens cell 10, has a top face 28, a bottom face 24, an outside diameter 26, an inner diameter 27 and a spherical surface 22. The lens 20 has an upper surface 23 and a bottom surface 21.

When the lens 20 and lens cell 10 are properly assembled together, in a manner described hereinbelow, their constituent elements have the following interrelationships: the outside diameter 26 of the lens cell is concentric about an axis of rotation 19; top face 28 and bottom face 24 are perpendicular to the axis of rotation 19; axis of rotation 19 is the symmetric axis of rotation of spherical seat 22; the spherical surface 21 of lens 20 matches the spherical seat 22 of the lens cell 10 (This relationship ensures that the optical axis of spherical surface 22 is the axis of rotation 19.); and the optical axis of the upper surface 23 of lens 20 is coincident with axis of rotation 19.

The above described interrelationships can be established in the manner described hereinbelow.

The lens cell is mounted on a lathe, preferably supported by air bearings, and machined, preferably using diamond point tooling. The machining apparatus does not constitute a part of the present invention and is, consequently, not shown. The outside diameter 26 of the lens cell 10 is machined to be concentric with the axis of rotation of the lathe, thus establishing the axis of rotation 19. Top face 28 and the bottom face 24 of the lens cell 10 are machined to be perpendicular to the axis. The spherical seat 22 is machined to match the curvature of the bottom surface 21 of lens 20. In addition, the spherical seat 22 is machined to have a symmetrical axis of rotation coincident with the axis of rotation 19.

Following its machining the lens cell is placed on a precision rotating surface, for example, an air-bearing table. It is then centered on its axis of rotation 19 by indicating the outer diameter 26 using, for example, an electronic/air gage. The lens 20 is then placed on the spherical seat 22 in the lens cell 10.

By precisely machining spherical seat 22 and matching spherical seat 22 to spherical surface 21 of lens 20 the optical axis of spherical surface 21 is on the axis of rotation 19. The optical axis of surface 23 of lens 20, however, may not be on the axis of rotation 19 where, for example, surface 23 is aspheric.

Accordingly, a gage, for example, an electronic/air gage, is placed on surface 23 and the lens cell 10 is caused to rotate, which causes the lens 20 to likewise rotate. The lens 20 is then rotated relative to the lens cell 10 so as to minimize the run out detected by the gage, not shown. A lubricant, such as Teflon or Moly, can be provided on spherical seat 22 to facilitate this movement process.

At this point the axis of rotation 19 is shared by the optical axes of surfaces 21 and 23 of the lens, the rotational axis of symmetry of spherical seat 22 and the axis of rotation of outer diameter 26 of the lens cell 10. In addition, the top face 28 and bottom face 24 of lens cell 10 are perpendicular to the axis of rotation 19.

Figure 2:
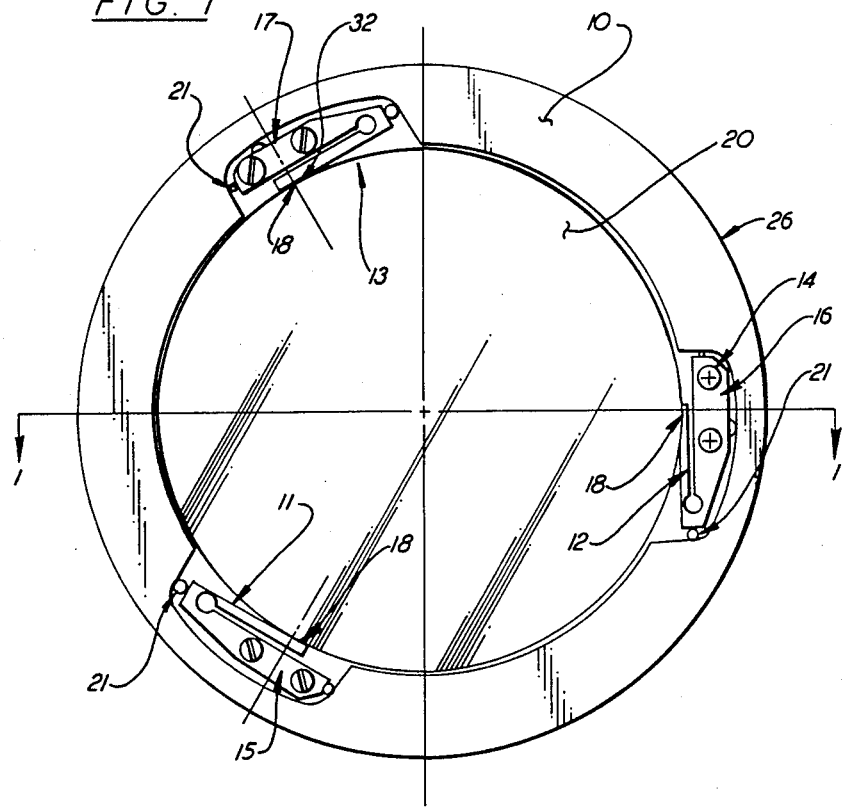
FIG. 2 is a plan view of the lens cell of FIG. 1.

FIG. 2 is a plan view of the lens cell 10 and lens 10 of FIG. 2. In addition, FIG. 2 shows the three flexure assemblies 15-17 used to bond the lens 20 to the cell 10. The flexure assemblies 15-17 are attached to the lens cell through the use of, for example, screws 14. After their attachment by screws 14 the flexure assemblies 15-17 can be rigidly fixed to the lens cell 10 by dabs of epoxy 21. The actual bonding for the lens 20 to the flexure assemblies 15-17 is accomplished by bonding the outer diameter of the lens 20 to the flexure arms 11-13 through an epoxy bondline 18. The epoxy bondline 18 is, for example, an ultra-violet curing epoxy and is applied in any convenient manner.

Figure 3:
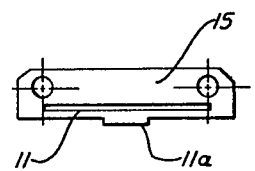
FIG. 3 shows a variation of the flexures of FIG. 2.

FIG. 3 shows a variation of the three flexure assemblies 15-17. In this variation both ends of each flexure arm, e.g., flexure arm 11 of flexure assembly 15 are connected to the main body of the flexure assemblies. In this case, the lens is bonded to the flexure arms at the center protrusions 11a, shown in FIG. 3.

The purpose and function of the flexure assemblies 15-17 is similar to that of the flexures described in U.S. Pat. application Ser. No. 818,925, filed Jan. 15, 1986 now U.S. Pat. No. 4,733,945 issued 3/29/88. Briefly, the flexure arms 11-13 attach the lens 20 to the lens cell 10 through the flexure assemblies 15-17, respectively. As the ambient temperature cycles up or down from a datum temperature the relative diameters of the lens 20 and lens cell change due to differing thermal coefficients of expansion. The flexure assemblies 15-17, through flexure arms 11-13, respectively, and bondlines 18 hold the lens 20. As the relative diameters of the lens 20 and lens cell 10 change the flexure arms 11-13 flex or move relative to the bodies of the flexure assemblies 15-17, hence relative to the lens cell 10. At no time do the flexure arms 11-13, lens 20 or bondline 8 reach the allowable stress limits of the respective materials.

When the ambient temperature returns to the datum temperature the lens 20 and lens cell 10 return to their original, as assembled, relationship.

The flexure assembes 15-17 thus allow compensation for ambient temperature changes and serve to constrain the lens 20 within the lens cell 10 with high stability and high resonance. That is, at the datum temperature the lens 20 is held in a substantially fixed spatial relationship to the lens cell 10.

Since the flexure assembles 15-17 are attached to the lens cell 10 through scews 14 and dabs of epoxy 21, they can be easily removed at any time. Such removal may be necessary if the lens cell 10 were improperly machined and it is desired to salvage the lens 20. In this case the lens 20, with attached flexure assembles 15-17, would be removed from the lens cell 10. A suitable solvent would be used to dissolve the bondline 18 between each of the flexure arms 11-13 and the lens 20. The lens 20, undamaged, is now ready for assembly in another lens cell in the manner hereinabove described.

A plurality of lens cells 10 machined in the manner described hereinabove, having substantially equal outside diameters 26 can be assembled in a co-axial assembly. This is done by stacking such a plurality of lens cells 10 in such a way that their outside diameters 26 share a common, imaginary, cylindrical surface. In this way the optical axes of all lenses within such a stack of lens cells are co-axial. By ensuring that the top face 28 and the bottom face 24 of the lens cell 10 are perpendicular to the axis of rotation 19 wedge conditions between lenses 20 in adjacent lens cells 10 can be eliminated or ameliorated. Following stacking and aligning the plurality of lens cells are epoxied together to form a unitary assembly, not shown. The stacking, aligning and epoxying of the plurality of lens cells can be accomplished in a manner similar to that described in U.S. Pat. application Ser. No. 818,925 filed Jan. 15, 1986 now U.S. Pat. No. 4,733,945 issued 3/29/88.

There has thus been described a lens mount which is unaffected by large temperature excursions, which can be easily machined without endangering its corresponding optical element or lens and which can be easily disassembled. Further, this lens mount is very stable and has a high resonance frequency and is stiff in the axial direction.

What is claimed is:

1. A lens mount comprising:
   a lens having a first surface of spherical configuration and a second surface;
   a lens cell having a top surface, a bottom surface, an outer diameter and an inner diameter;
   said outer diameter being concentric about an axis of rotation of said lens cell;
   said top surface and said bottom surface being substantially perpendicular to said axis of rotation;
   a lens seat projecting inwardly from said inner diameter;

said lens seat having a radius of curvature match-mated to the curvature of said first surface of said lens;

the rotational symmetry axis of said lens seat being coincident with the axis of rotation of said lens cell;

the first surface of said lens being substantially in contact with said lens seat;

the optical axis of said second surface being aligned substantially coincident with the axis of rotation of said lens cell;

a plurality of flexures holding said lens to said lens cell;

each of said flexures being removably attached to said lens cell;

each of said flexures comprising:
 a flexure assembly attached to said lens cell;
 a flexure arm attached at both ends to said flexure assembly and at its center to said lens; and
 said flexure arm being substantially parallel to and spaced from said flexure assembly.

2. A lens mount as claimed in claim 1 wherein said flexure arm is attached to said lens with epoxy.

* * * * *